United States Patent
Nakarai et al.

(10) Patent No.: US 12,347,710 B2
(45) Date of Patent: Jul. 1, 2025

(54) STORAGE CONTAINER AND MANUFACTURING METHOD OF THE SAME

(71) Applicant: Shin-Etsu Polymer Co., Ltd., Tokyo (JP)

(72) Inventors: Seiya Nakarai, Saitama (JP); Osamu Ogawa, Saitama (JP); Kiminori Tominaga, Niigata (JP); Shinichi Ohori, Niigata (JP); Tadahiko Ishizawa, Niigata (JP)

(73) Assignee: SHIN-ETSU POLYMER CO., LTD., Tokyo (JP)

( * ) Notice: Subject to any disclaimer, the term of this patent is extended or adjusted under 35 U.S.C. 154(b) by 34 days.

(21) Appl. No.: 18/002,803

(22) PCT Filed: Jul. 1, 2021

(86) PCT No.: PCT/JP2021/024949
§ 371 (c)(1),
(2) Date: Dec. 21, 2022

(87) PCT Pub. No.: WO2022/019081
PCT Pub. Date: Jan. 27, 2022

(65) Prior Publication Data
US 2023/0245907 A1 Aug. 3, 2023

(30) Foreign Application Priority Data
Jul. 22, 2020 (JP) ................. 2020-125290

(51) Int. Cl.
*H01L 21/673* (2006.01)
*B65D 25/10* (2006.01)
(Continued)

(52) U.S. Cl.
CPC ...... *H01L 21/67383* (2013.01); *B65D 25/107* (2013.01); *B65D 25/54* (2013.01);
(Continued)

(58) Field of Classification Search
CPC ............... H05K 7/20; H01L 21/67386; H01L 21/67366; H01L 21/67383; B65D 25/107; B65D 25/54; B65D 85/30
(Continued)

(56) References Cited

U.S. PATENT DOCUMENTS 4,793,488 A * 12/1988 Gregerson ........ H01L 21/67373
206/711
6,382,419 B1 * 5/2002 Fujimori ........... H01L 21/67369
211/41.18
(Continued)

FOREIGN PATENT DOCUMENTS

JP  2006-324327 A  11/2006
JP  2010-027861 A  2/2010
(Continued)

OTHER PUBLICATIONS

International Search Report issued in Application No. PCT/JP2021/024949 mailed on Sep. 7, 2021 (6 pages).
(Continued)

*Primary Examiner* — Chun Hoi Cheung
(74) *Attorney, Agent, or Firm* — Osha Bergman Watanabe & Burton LLP

(57) ABSTRACT

A storage container with improved strength and airtightness, and a method for manufacturing the storage container are provided. The storage container includes, as a functional resin member, an insert component for a container body insert-molded with a molding material containing predetermined resin. The functional resin member is a side wall plate with support pieces. The side wall plate has a thick portion having at least a thickness of a side wall of the container body, and a thin joint portion formed around the thick portion, to be interposed into and joined to a peripheral wall of the container body. Most of the peripheral wall and the thin joint portion are engaged and joined to enlarge their
(Continued)

contact area to eliminate a decrease of the mechanical strength and leakage around the peripheral edge of the side wall plate and prevent the peripheral wall from parting from the side wall plate.

6 Claims, 15 Drawing Sheets

(51) Int. Cl.
  *B65D 25/54* (2006.01)
  *B65D 85/30* (2006.01)
(52) U.S. Cl.
  CPC ........ *B65D 85/30* (2013.01); *H01L 21/67366* (2013.01); *H01L 21/67386* (2013.01)
(58) Field of Classification Search
  USPC ........ 206/710–711, 832, 557–567, 449–456; 264/259
  See application file for complete search history.

(56) References Cited

U.S. PATENT DOCUMENTS

| | | | | |
|---|---|---|---|---|
| 7,926,663 | B2* | 4/2011 | Hosoi | ............... H01L 21/67379 |
| | | | | 211/41.18 |
| 11,417,554 | B2* | 8/2022 | Toda | ................... H01L 21/6734 |
| 2003/0029765 | A1* | 2/2003 | Bhatt | ................ B29C 45/14311 |
| | | | | 211/41.18 |
| 2006/0283774 | A1 | 12/2006 | Hasegawa et al. | |
| 2009/0038984 | A1 | 2/2009 | Hosoi | |
| 2016/0053788 | A1* | 2/2016 | Iwano | ....................... F16B 5/08 |
| | | | | 403/268 |
| 2020/0279761 | A1 | 9/2020 | Ogawa | |
| 2020/0373180 | A1 | 11/2020 | Toda et al. | |

FOREIGN PATENT DOCUMENTS

| | | |
|---|---|---|
| JP | 2020-17649 A | 1/2020 |
| KR | 20150144974 A | 12/2015 |
| WO | 2006/120866 A1 | 11/2006 |
| WO | 2009/107254 A1 | 9/2009 |
| WO | 2019/031142 A1 | 2/2019 |
| WO | 2019-097832 A1 | 5/2019 |

OTHER PUBLICATIONS

Written Opinion issued in Application No. PCT/JP2021/024949 mailed on Sep. 7, 2021 (4 pages).
Office Action issued in the counterpart Japanese Application No. 2020-125290, mailed Oct. 10, 2023 (6 pages).

* cited by examiner

STORAGE CONTAINER AND MANUFACTURING METHOD OF THE SAME

TECHNICAL FIELD

The present invention relates to a storage container used for storing, transporting, and preserving various kinds of substrates and the like, and a method for manufacturing the same.

BACKGROUND ART

Though not shown, the conventional storage container includes a container body for storing a plurality of semiconductor wafers and a removable lid that is fitted to the open front of the container body with an elastic sealing gasket therebetween, and functions as a FOUP for safely storing, transporting, and preserving a plurality of semiconductor wafers (see Patent Documents 1, 2, and 3).

The semiconductor wafer is of a silicon wafer with a diameter of 300 mm and is heated to a high temperature as needed. The container body is molded into a front open box using a molding material containing a specific resin. Formed on the inner surfaces of both side walls of the box are paired support pieces on left and right sides for horizontally supporting the semiconductor wafer. These paired left and right support pieces are arranged vertically at regular intervals so as to hold the sides of the peripheral edge of the semiconductor wafers. Further, the lid is formed in a substantially rectangular shape in front view and has front retainers that are attached to the interior surface opposing the rear wall of the container body, to hold the front of the peripheral edge of the semiconductor wafers with elastic pieces.

Incidentally, since the side walls of the container body and the surface of the support pieces may be damaged by sliding contact of the peripheral edge of the semiconductor wafers, it is desirable to provide excellent wear resistance and slidability in order to prevent occurrence of damage. In view of dealing with this demand, there has been a method developed and proposed, comprising the steps of: molding two container body's side walls with support pieces as primary insert components by using a molding material having excellent wear resistance and slidability; inserting both side walls molded as the primary insert components into the metal mold for molding the container body, then filling a molding resin for the container body in the metal mold to thereby integrate the both two side walls and the resin and form the second side container body by the insert molding.

PRIOR ART DOCUMENTS

Patent Documents

Patent Document 1 International Publication WO2009/107254
Patent Document 2 International Publication WO2019/031142
Patent Document 3 International Publication WO2006/120866

SUMMARY OF THE INVENTION

Problems to be Solved by the Invention

However, by use of the insert molding method for the container body, it is possible to impart excellent wear resistance and slidability to the side walls and the support pieces of the container body, but depending on the configuration of the side walls with support pieces as the insert components, there is a risk of the deterioration of the strength and leakage properties of the insert-molded container body. For example, when the peripheral edge of the side wall with support pieces is simply a flat surface, the flat surface of the peripheral edge and the molten resin for the container body do not bond sufficiently but separate from each other, which may cause the problem of the deterioration of the strength and leakage properties of the side walls of the insert molded container body.

The present invention has been devised in view of the above, and it is an object of the present invention to provide a storage container capable of improving the strength and airtightness of the container to be molded, as well as providing a method for manufacturing the same.

Means for Solving the Problems

In order to achieve the above object, the present invention provides a container using an insert component as a functional resin member for the container that is insert-molded with a resin-containing molding material, wherein the functional resin member comprises: a thick portion having a thickness equal to or greater than a thickness of a wall of the container; and a thin joint portion formed in the thick portion, and the thin joint portion is interposed into and joined to the wall of the container.

Here, a resin as the molding material is a thermoplastic resin, and the functional resin member can be molded with a resin having excellent heat resistance.

The resin having excellent heat resistance for the functional resin member may use at least one of a polyether ether ketone resin, a polycarbonate resin, and a cycloolefin polymer resin.

Further, the resin for the molding material is the thermoplastic resin, and the functional resin member can be molded with a resin having at least better heat resistance than the thermoplastic resin for the molding material.

The resin having at least better heat resistance than that of the thermoplastic resin for the molding material can use at least one of the polyether ether ketone resin and the cycloolefin polymer resin.

The container may be given in the form of a front open box container body capable of arranging and storing a plurality of substrates.

The functional resin member may be a side wall plate in which a plurality of support pieces are arranged adjacent to one another, each support piece being capable of supporting a side of a peripheral edge of a substrate.

The functional resin member may be a window plate that forms a rear portion of the container body and allows a stored substrate to be seen.

The thin joint portion of the functional resin member is preferably a rib protruding from a peripheral edge of the thick portion of the functional resin member.

The rib of the thin joint portion may be formed with a bulging portion protruded at least in a direction crossing a protruding direction of the rib.

Further, a molding material flow hole may be formed in the rib of the thin joint.

Further, the molding material flow hole may be formed in at least one of the rib and the bulging portion of the thin joint.

In order to achieve the above object, one or more embodiments of the present invention provide a manufacturing method for the storage container, the method comprising the steps of:

inserting a functional resin member into a mold for molding the container; and, filling the mold with a resin-containing molding material to form the container by integrating the functional resin member with the molding material.

Here, the molding material within the scope of the claims can contain various fillers in addition to the resin, as required. The resin for the molding material and the resin for the functional resin member may have good compatibility or poor compatibility. Further, an insert molding may include two-color molding (also referred to as multicolor molding or different material molding). The container may be a front open box such as FOUP or FOSB, a top open box, a bottom open box, a cassette having openings at top and bottom, or the like, and various items other than substrates may be stored. The wall of the hollow container depends on the type of the container, but examples include a peripheral wall of the container, for example, a base plate, a ceiling plate, a front wall, a rear wall, and a side wall of the container.

For example, the functional resin member that is an insert component is used for a necessary number of positioning tools and the like that are used for positioning and formed directly or indirectly as a wall plate with support pieces, a window plate with support pieces, and a bottom plate with support pieces of the container. The functional resin member may mainly use resins such as polyether ether ketone resin, polycarbonate resin, and cycloolefin polymer resin, but not particularly limited, and various resins may be selected depending on the configuration and application of the container so as to improve the strength and airtightness of the container.

A plurality of support pieces on the side wall plate can be arranged with a groove therebetween. Further, the thin joint portion of the functional resin member may have a cross section of, for example, a substantially I-shape, a substantially L-shape, a substantially T-shape, a substantially mushroom shape, a substantially cross shape, a substantially trapezoidal shape, a substantially arrow shape, or the like. The thin joint portion may be partially thicker than the thick portion. The thin joint portion is interposed into the wall of the container, and the interposed state may include a state of being engaged with the wall of the container, a state of being inserted in the wall of the container, and a state of being fitted in the wall of the container. Further, the substrate may include at least a semiconductor wafer, a glass substrate, a mask substrate, a liquid crystal glass, a reticle and the like, each of which has 300 mm or 400 mm in diameter.

According to the present invention, when a container is insert molded, the flat surface of the container wall and the flat surface of the functional resin member are not merely butted and joined, but the container wall and the thin joint portion of the functional resin member are joined into a bonded state in which the two components get entangled mechanically, so that the contact area between the wall of the container and the thin joint portion of the functional resin member can be enlarged.

Advantages of the Invention

According to the present invention, since the thin joint portion of the functional resin member is interposed into the wall of the container and joined, it is possible to improve the strength and airtightness of the container to be molded.

According to the invention of claim 2, since the container comprises a front open box container body capable of arranging and storing a plurality of substrates, it is possible to safely store and preserve the plurality of substrates side by side.

According to the invention of claim 3, when the functional resin member is given as a side wall plate in which a plurality of support pieces capable of supporting the sides of the peripheral edge of a substrate are arranged, it is possible to prevent reduction of the mechanical strength and airtightness around the peripheral edge of the side wall plate in the side wall of the container body.

According to the invention of claim 4, when the functional resin member is given as a window plate that forms the rear portion of the container body and allows the stored substrates to be seen, it is possible to prevent reduction of the mechanical strength and airtightness around the peripheral edge of the window plate in the rear wall of the container body.

According to the invention of claim 5, since the thin joint portion of the functional resin member is a rib projected from the peripheral edge of the thick portion of the functional resin member, the wall of the container can be easily and surely joined by interposing the thin joint portion.

According to the invention of claim 6, since the rib of the thin joint portion is formed with the bulging portion protruded at least in the direction crossing the projected direction of the rib, the thin joint portion of the functional resin member interposed into the wall of the container becomes hard to separate from the container wall.

According to one or more embodiments of the invention, since the molding material of the container flows into the molding material flow hole and solidifies therein, the wall of the container and the functional resin member are firmly bonded so that it is possible to prevent a decrease of the mechanical strength and airtightness around the peripheral edge of the functional resin member.

According to one or more embodiments of the invention, since the container is insert-molded, it is possible to easily integrate even different molding materials and improve the joint strength between the container and the functional resin member as well as the durability of the container. Further, since it is possible to omit the work of fastening the container wall and the functional resin member with fasteners, the manufacturing steps of the container can be reduced and the positional accuracy of the functional resin member can be improved.

MODE FOR CARRYING OUT THE INVENTION

Figure 1:
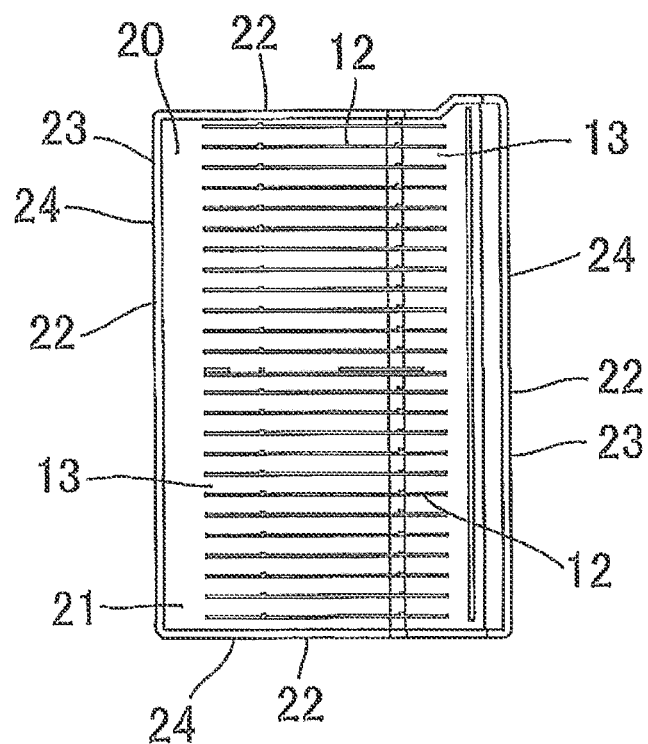
FIG. 1 An outer side view schematically showing a side wall plate in an embodiment of a storage container according to the present invention.
Figure 2:
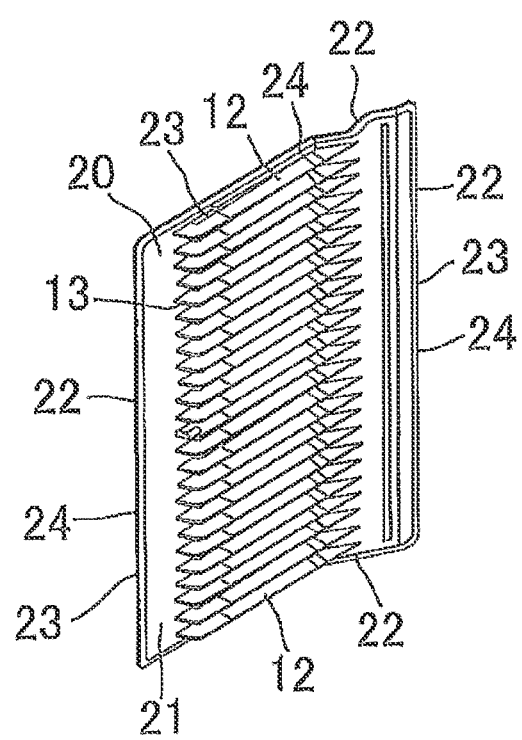
FIG. 2 A perspective view schematically showing the side wall plate according to the embodiment of the storage container according to the present invention.
Figure 3:
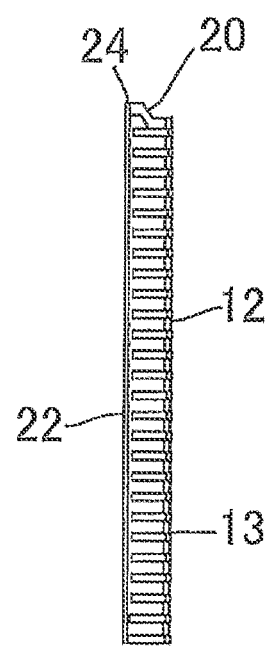
FIG. 3 A rear view schematically showing the side wall plate in the embodiment of the storage container according to the present invention.
Figure 4:
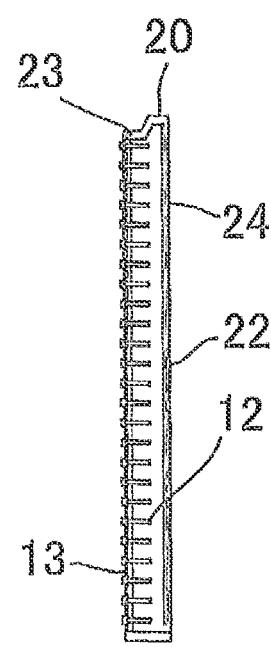
FIG. 4 A front view schematically showing the side wall plate in the embodiment of the storage container according to the present invention.
Figure 5:
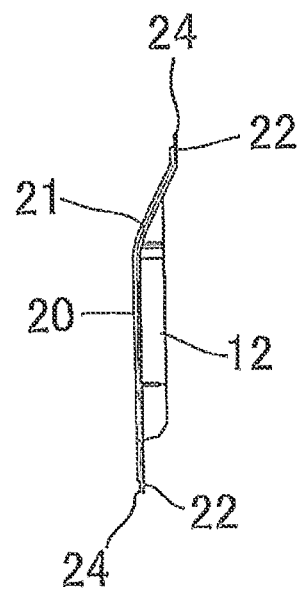
FIG. 5 A plan view schematically showing the side wall plate according to the embodiment of the storage container according to the present invention.
Figure 6:
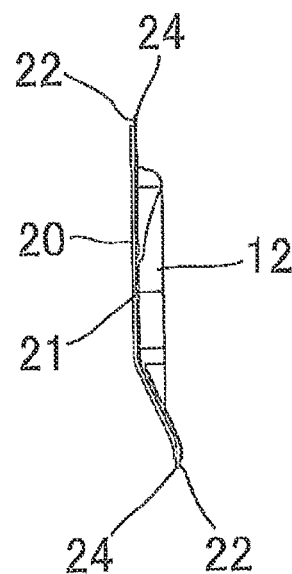
FIG. 6 A bottom view schematically showing the side wall plate according to the embodiment of the storage container according to the present invention.
Figure 7:
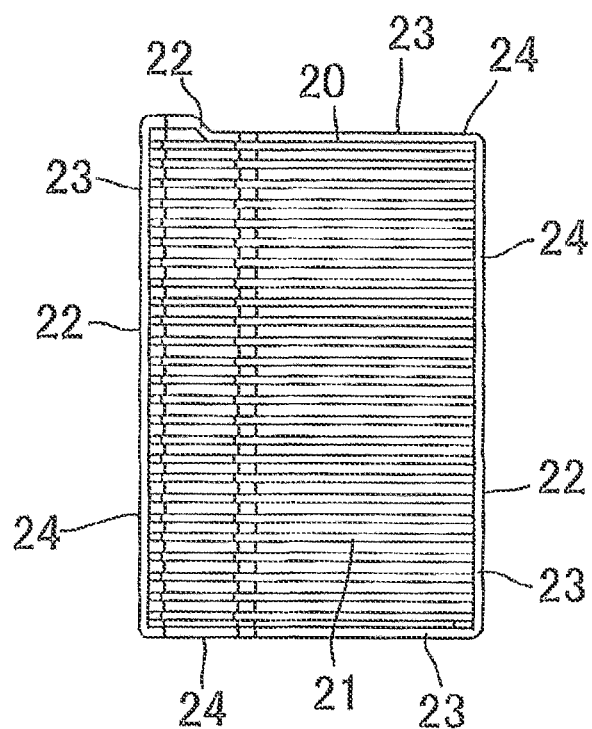
FIG. 7 A back side view schematically showing the side wall plate according to the embodiment of the storage container according to the present invention.

Hereinafter, a preferred embodiment of the present invention will be described with reference to the drawings. As shown in FIGS. 1 to 11, a storage container of the present embodiment is a FOUP, which includes, as functional resin members, insert components in a container body 1 that is insert-molded by using a molding material containing specific resin. The functional resin members constitute part of a peripheral wall 2 of the container body 1, specifically, side wall plates 20 that form most part of side walls 11 to provide a supporting function of semiconductor wafers. In the storage container, a thin joint portion 22 of the side wall plate 20 is mechanically joined.

Figure 8:
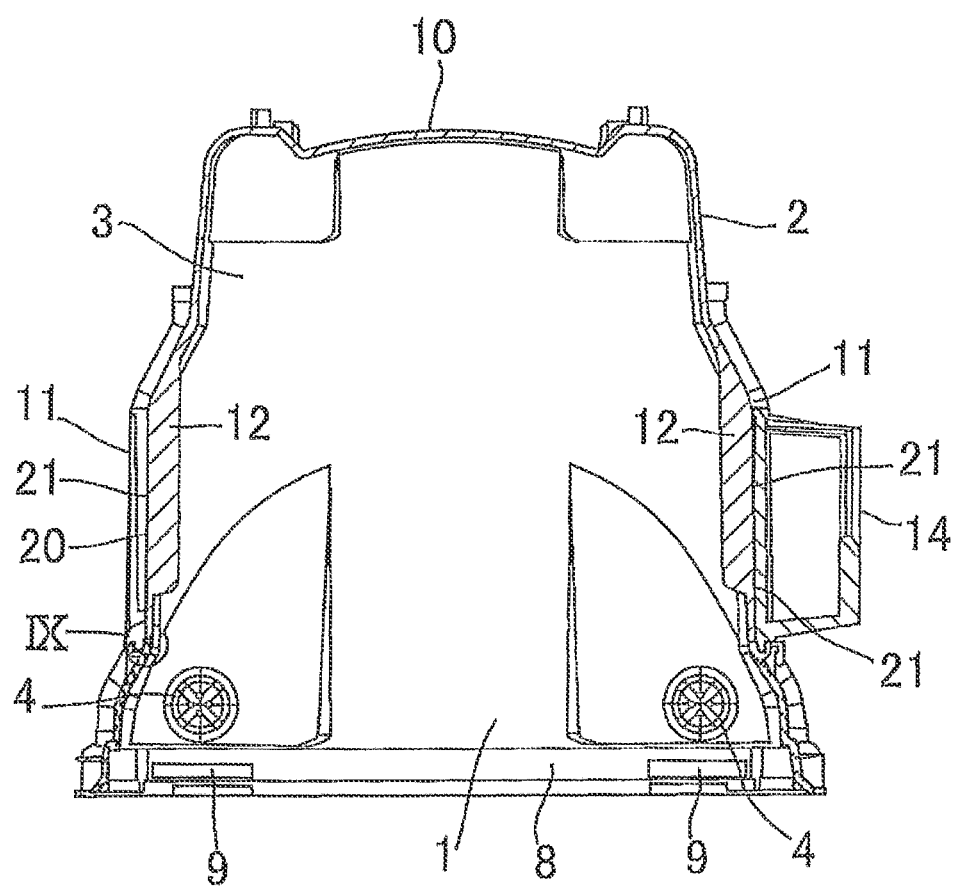
FIG. 8 A sectional plan view schematically showing a container body in the embodiment of the storage container according to the present invention.
Figure 10:
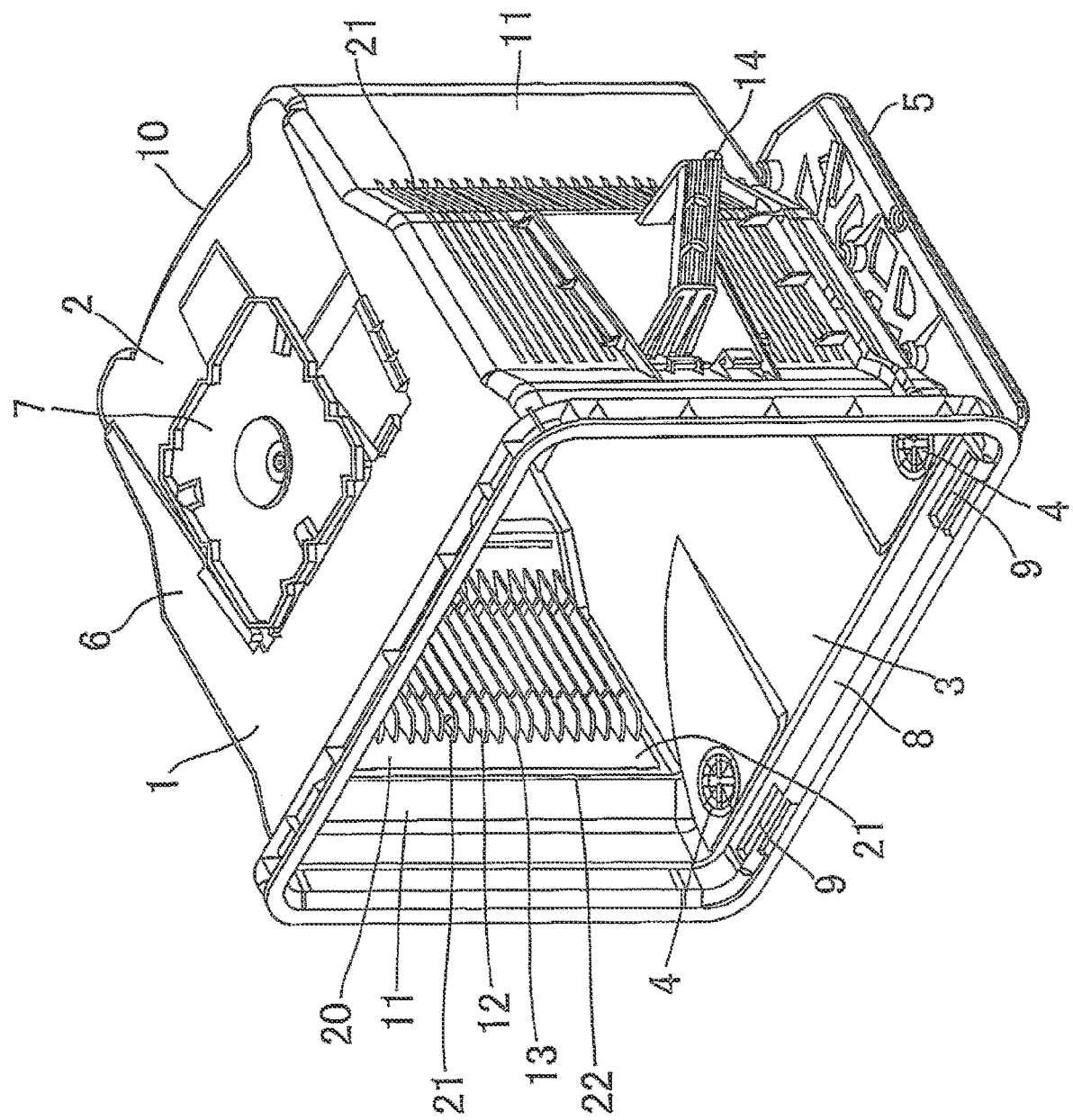
FIG. 10 A perspective illustrative view schematically showing the container body in the embodiment of the storage container according to the present invention.
Figure 11:
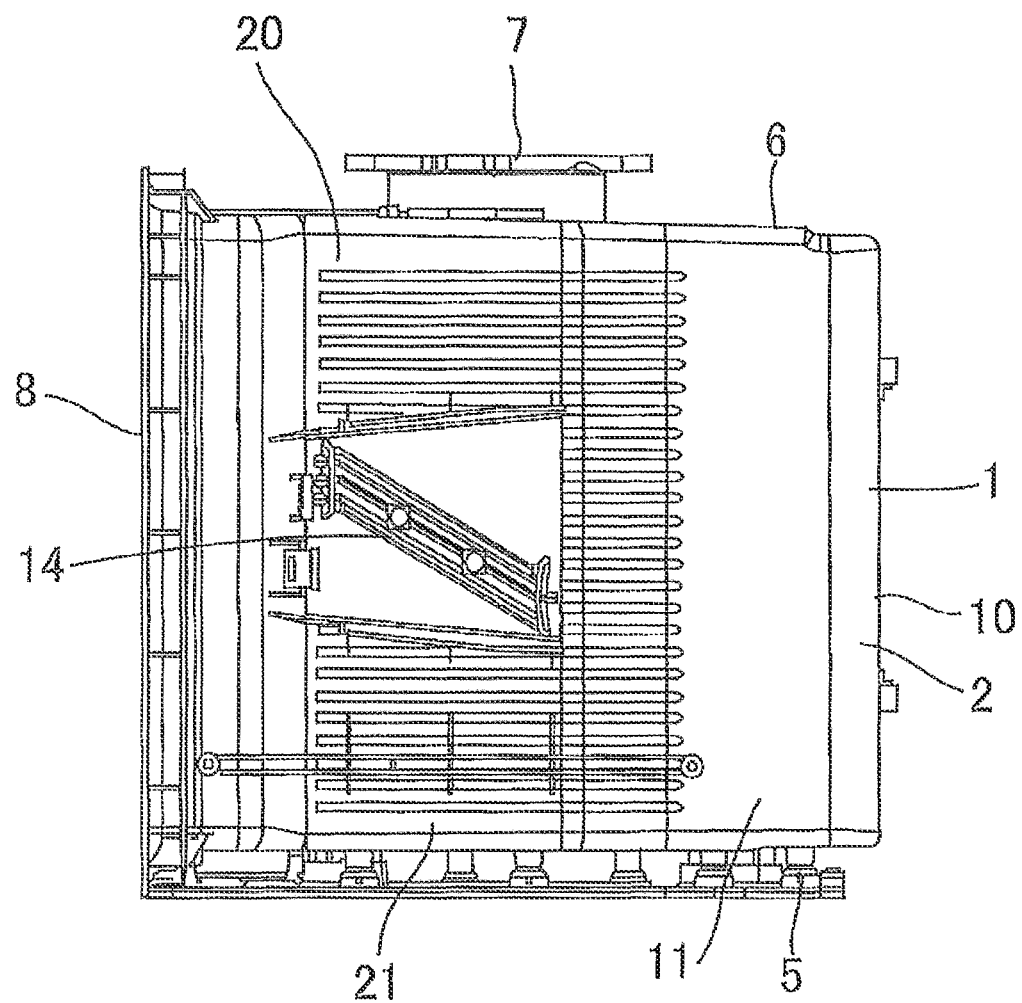
FIG. 11 An illustrative side view schematically showing the container body in the embodiment of the storage container according to the present invention.
Figure 12:
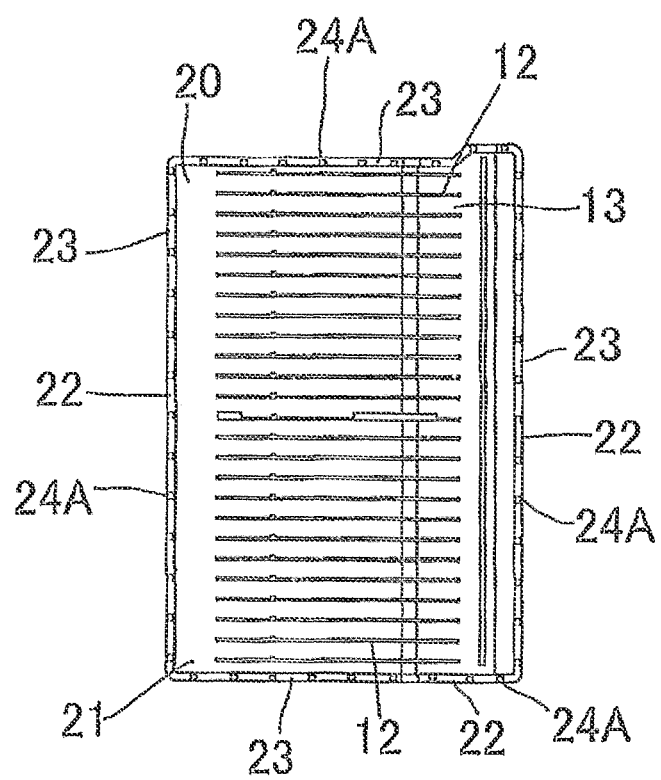
FIG. 12 An outer side view schematically showing the side wall plate according to a second embodiment of a storage container according to the present invention.
Figure 13:
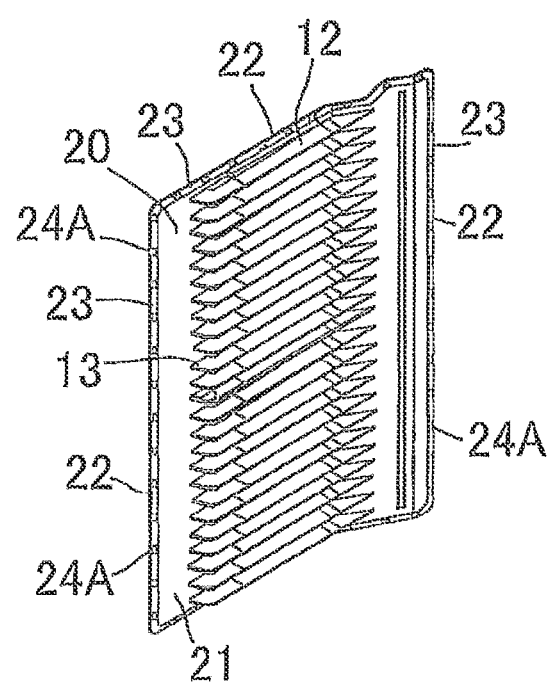
FIG. 13 A perspective view schematically showing the side wall plate according to the second embodiment of the storage container according to the present invention.
Figure 14:
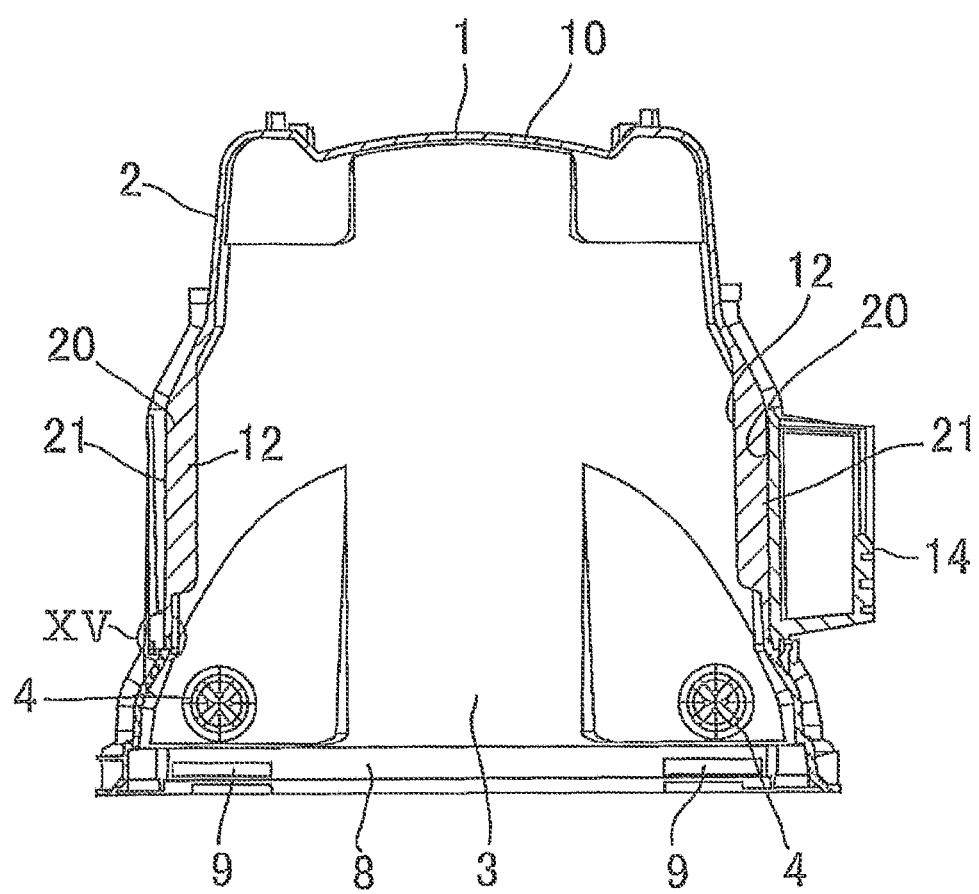
FIG. 14 A sectional plan view schematically showing the container body according to the second embodiment of the storage container according to the present invention.

As shown in FIGS. 8, 10, and 11, the container body 1 is made by insert molding with a predetermined resin-containing molding material. The container body 1 is a front open box capable of storing a plurality of semiconductor wafers in alignment. A lid with a built-in locking mechanism is detachably fitted to the opened front 8 with a frame-shaped sealing gasket inserted therebetween. Examples of the specific resin in the molding material of the container body 1 include thermoplastic resins such as polycarbonate (PC) resin, cycloolefin polymer (COP) resin, cycloolefin copolymer (COC) resin, polypropylene (PP) resin, and polyetherimide (PEI) resin, polyether ketone (PEK) resin, polyether ether ketone (PEEK) resin, polybutylene terephthalate (PBT) resin, polyacetal (POM) resin, liquid crystal polymers, and alloys of these.

As the molding material of the container body 1, in addition to the above resin, conductive substances such as carbon black, acetylene black, carbon fiber, carbon powder, carbon nanotubes, conductive polymers as well as various anti-static agents such as, anion, cation, non-ion, are added as necessary. Further, benzotriazole-based, salicylate-based, cyanoacrylate-based, oxalic acid anilide-based, and hindered amine-based ultraviolet absorbers are added. Also, glass fibers and others that improve rigidity may be selectively added.

Though not illustrated, the semiconductor wafer is, for example, a thin and brittle high-quality silicon wafer having a diameter of 300 mm, and 25 wafers are housed inside the container body 1, being arranged in the vertical direction at a predetermined interval. The peripheral edge of the semiconductor wafer may be formed angularly with straight sides but is generally formed in a round R-shape, C-shape, round shape, or the like by chamfering the peripheral side. Further, the semiconductor wafer is heated to a high temperature as necessary in the manufacturing process.

Though not shown, the lid is formed in a substantially rectangular shape when viewed from the front, having a locking mechanism by combining a plurality of parts, and has a vertically long front retainer that hold the semiconductor wafers at the front peripheral edge by laterally long elastic pieces, attached in a middle part on a back side that opposes the rear wall 10 of the container body 1. The lid and the locking mechanism are molded using a molding material substantially the same as the molding material of the container body 1.

As shown in FIGS. 8 and 10, percolation filters 4 are mounted on both sides of the front portion of a base plate 3 of the container body 1, and these paired filters 4 on the left and right sides functions to make the pressures inside and outside the container body 1 uniform. Attached horizontally to the undersurface of the base plate 3 of the container body 1 is a resin bottom plate 5 by a plurality of fasteners. Positioning tools for positioning the container to a processing device or the like are formed and arrayed on both sides of the front portion of the bottom plate 5 and at the rear center thereof while an RF tag or the like opposing the lower part of the rear wall 10 of the container body 1 is optionally erected at the rear end portion of the bottom plate 5.

As shown in FIGS. 10 and 11, a flat rectangular robotic flange 7 is detachably attached as an option to the substantially center of the ceiling plate 6 of the container body 1. This robotic flange 7 is held by an unillustrated overhead transfer mechanism in a factory. Further, as shown in FIGS. 8, 10 and 11, the front 8 of the container body 1 is formed via a step portion as it bends and stretches outward in the width direction from the peripheral wall 2 of the container body 1. The flat shoulder surface of the step portion defines a seal forming surface for the sealing gasket of the lid. Locking holes 9 that engage the locking claws of the locking mechanism of the lid are hollowed at the top and bottom on both sides on the inner circumference of the front of the container body 1, each locking hole 9 being formed in a rectangular shape in a plan view.

A transparent vertically long viewer window is optionally formed in the vicinity of the central of the slightly curved rear wall 10 of the container body 1 so that a plurality of stored semiconductor wafers can be seen from the outside. Further, on the inner surface of the rear wall 10, a plurality of rear retainers that can interfere with the rear peripheral edge of the semiconductor wafer in an emergency are optionally formed and arrayed.

Most of the side walls 11 of the container body 1 are formed with the side wall plates 20 that are functional resin members, and the rest of the side walls 11 are formed of the solidified molding material of the container body 1. As shown in FIGS. 8, 10, and 11, a pair of left and right support pieces 12 opposing each other for horizontally supporting the semiconductor wafer are provided on inner surfaces of both side walls 11 of the container body 1, at a predetermined interval in a vertical direction of the container body 1. A U-shaped groove 13 having a substantially U-shaped cross section is formed between the vertically adjacent support pieces 12. Each support piece 12 is provided in the form of an elongated substantially horizontal plate extending in the front-rear direction and supports the side peripheral edge of the semiconductor wafer.

As shown in the same figures, an operation handle plate 14 for gripping is detachably attached as an option to the outer surface of each of both side walls 11 of the container body 1. Side rails for transportation are detachably attached, as required, to the outer lower portion of the side walls 11, at a location under the operation handle plate 14, each side rail being oriented horizontally in the front-rear direction of the container body 1.

As shown in FIGS. 1 to 11, each side wall plate 20 is composed of: a thick portion 21 having a thickness equal to or more than the thickness of the rest of the side wall 11 of the container body 1; and a thin joint portion 22 which is formed along the peripheral edge of the thick portion 21 to be joined and interposed into the peripheral wall 2 of the container body 1, thus forming most part other than the front and rear of the side wall 11 of the container body 1. When the resin of the side wall plate 20 is demanded to be more excellent in wear resistance, slidability, heat resistance, and the like than the thermoplastic resin of the molding material of the container body 1, the side wall plate 20 is formed into a bent plate with, for example, a polyether-ether-ketone (PEEK) resin or the like.

Further, when the resin of the side wall plate 20 is demanded to be more excellent in heat resistance, impact resistance, weather resistance, dimensional stability, transparency, and the like, the side wall plate 20 is formed into a bent plate with, for example, a polycarbonate resin, and the like. When the resin is demanded to be more excellent in heat resistance, transparency, precision moldability, and the like, the side wall plate 20 is formed into a bent plate with, for example, a cycloolefin polymer (COP) resin.

The thick portion 21 of the side wall plate 20 is formed in a vertically long plate having a wall thickness equal to, or greater than, that of the remaining part of the side wall 11 of the container body 1 so that the inner and outer surfaces of the side wall 11 of the container body 1 will not have unevenness. The side wall has a rear part bent inward of the container body 1 and a plurality of support pieces 12 arranged on the inner surface (surface) in the vertical direction at predetermined intervals. U-shaped grooves 13 extending in the front-rear direction are formed in such a state each groove is interposed between the vertically adjacent support pieces 12.

The thickness of the thick portion 21 may be the same as the thickness of the remaining part of the side wall 11 of the container body 1, but it is 0.05 mm thicker, more preferably about 0.1 mm thicker, than the thickness of the remaining part of the side wall 11 of the container body 1, considering the shrinkage of the resin after cooling. Of the inner and outer surfaces of the thick portion 21, at least the inner surface is formed to be flush with the inner surface of the remaining side wall 11 of the container body 1 at the time of insert molding of the container body 1 from the viewpoint of pertinent positioning and storage of semiconductor wafers.

Figure 9:
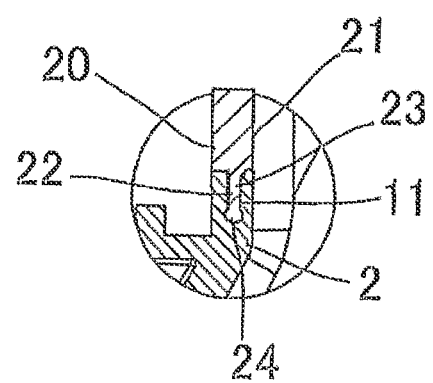
FIG. 9 An enlarged sectional illustration showing a portion IX in FIG. 8.

As shown in FIG. 9, the thin joint portion 22 is made in a shape having a substantially mushroom-shaped cross-section comprising: a rib 23 that protrudes outward from the peripheral edge of the thick portion 21 of the side wall plate 20; and a bulging portion 24 at the distal end of the rib 23, protruding in the direction (left-right direction in FIG. 9) at least orthogonal to the protruding direction of the rib 23. The thin joint portion 22 forms a boundary between the thick portion 21 and the peripheral wall 2 of the container body 1, specifically, the base plate 3, the ceiling plate 6, and the remaining part of the side wall 11, all of which are of the container body 1.

As shown in FIG. 9, in order to make the rib 23 secure and easy to be interposed and inserted into the peripheral wall 2 of the container body 1, the rib 23 protrudes, with a thin-plate form, from the entire circumferential edge of the thick portion 21, and surrounds the thick portion 21 endlessly. Further, the bulging portion 24 may have a substantially V-shaped cross-section, but in view of making it difficult to come off from the base plate 3 side portion of the container body 1, the ceiling plate 6 side portion of the container body 1, and the side wall 11 remaining portion of the container body 1, and securing good formability and fastening strength, it is preferable that the bulging portion is formed in an endless undercut shape. Specifically, the bulging portion is formed so as to have a rounded substantially rhombus-shaped cross-section or a substantially circular-shaped cross-section. This thin joint portion 22 functions to join the thick portion 21 of the side wall plate 20 and the peripheral wall 2 of the container body 1 that are located opposite to each other, by using a board joint method (joining method in the construction field), specifically, a dovetail method in the board joint method.

In the above configuration, when manufacturing the container body 1 of the storage container, first, the side wall plate 20 on the primary side, which is a functional resin member, is injection molded. A pair of side wall plates 20 are inserted into the mold for molding of the container body 1 with its mold opened, then the mold is clamped. The clamped mold is injected and filled with a plasticized molding material to integrate the pair of side wall plates 20 and the molten molding material to complete insert molding of the container body 1 on the secondary side.

In this process, the molding material injected and filled in the mold stops flowing when the injection is completely filled, and is cooled and solidified as the mold deprives the molding material of heat, to form most of the peripheral walls 2 of the container body 1. The opposing portions of the peripheral wall 2 of the container body 1 (base plate 3 side portion, ceiling plate 6 side portion, the remaining portion of the side wall 11) that are located opposite to each of the side plates 20 are deformed into shapes having a substantially U-shaped section so as to interpose the thin joint portion 22 of each of the side wall plates 20 by shrinkage and robustly join and integrate the most part of the peripheral wall 2 of the container body 1 and side wall plates 20 (see FIG. 9). This joining completely forms both the side walls 11 of the container body 1, and the peripheral wall 2 of the container body 1 takes a perfect configuration.

After insert molding the container body 1 on the secondary side, the container body 1 is left and cooled until the resin of the molding material acquires sufficient rigidity, and then the mold is opened and the container body 1 is removed by the push-out mechanism, whereby the container body 1 of the storage container can be manufactured by insert molding.

According to the above configuration, when the container body 1 is insert-molded, the flat surfaces of the peripheral wall 2, which is the most part of the container body 1, and the side wall plates 20 formed with support pieces 12 are not simply abutted and joined to each other. But the peripheral wall 2 forming the large part of the main body 1 and the thin joint portion 22 of the side wall plate 20 are meshed with each other and joined to expand the contact area therebetween. It is therefore possible to eliminate a decrease in mechanical strength and leakage performance around the peripheral edge of the side wall plates 20 in the side walls 11 of the container body 1 and prevent the peripheral wall 2 of the container body 1 from parting from the side wall plate 20.

Further, since excellent wear resistance and slidability can be imparted to the side walls 11 of the container body 1 and the support pieces 12, it is possible to prevent damage to the both side walls 11 of the container body 1 and the surface of support pieces 12 due to sliding their contact with the round peripheral edge of the semiconductor wafer, and generation of particles can be expectedly prevented. Further, correct selection of the resin of the side wall plate 20 can impart excellent heat resistance to the side walls 11 of the container body 1 and the support pieces 12, so that even if the semiconductor wafers are heated to a high temperature, it can be expected to prevent deformation and melting of the support pieces 12 that come into contact with the wafers. For example, choice of a polycarbonate resin as the resin for the side wall plates 20 makes it possible to impart excellent heat resistance, impact resistance, weather resistance, dimensional stability, transparency, and the like to both side walls 11 of the container body 1 and the support pieces 12.

Next, FIGS. 12 to 15 show the second embodiment of the present invention. In this case, the thin joint portion 22 of the side wall plate 20 is modified to enlarge the contact area with the molding material of the container body 1.

Figure 15:
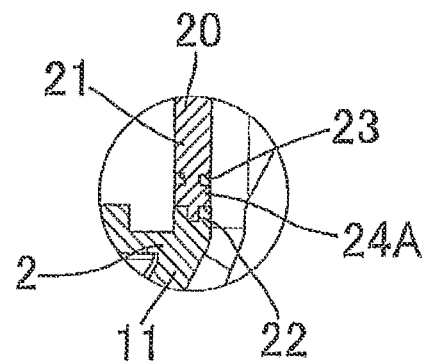
FIG. 15 An enlarged sectional illustration showing a portion XV in FIG. 14.

As shown in FIG. 15, the thin joint portion 22 in the present embodiment is formed to have a substantially cross-shaped cross section comprising: a rib 23 protruding outward from the peripheral edge of the thick portion 21 of the side wall plate 20; and a plurality of bulging ribs 24A protruding from both sides of the middle part of the rib 23 in the directions orthogonal to the protruding direction of the rib 23. The thin joint portion 22 forms a boundary between the thick portion 21 and the peripheral wall 2 of the container body 1, specifically the base plate 3, ceiling plate 6 and the remaining part of the side walls 11 of the container body 1.

The rib 23 is protruding, with a thin plate form, from the entire edge of the thick portion 21, and surrounds the thick portion 21 endlessly. Further, a plurality of bulging ribs 24A are arranged at a predetermined interval in the longitudinal direction of the ribs 23. Each bulging rib 24A is formed in a substantially rib shape with a rounded cross section, and is interposed between and covered by the opposing part of the peripheral wall 2 of the container body 1, the opposing part being located opposite to each of the side wall plates 20. The thickness of the bulging rib 24A is thicker than the thickness of the rib 23, and approximately the same as the wall thickness of the thick portion 21. Since the other parts are the same as those in the above embodiment, the description is omitted.

Also in this embodiment, the same advantages as those in the above embodiment can be expected, and since the bulging rib 24A is thick and is complicatedly interposed into the peripheral wall 2 of the container body 1 and is difficult to become detached, it is clear that the strength of the thin joint portion 22 can be increased and the mechanical strength near the peripheral edge of the side wall plate 20 can be improved.

Figure 16:
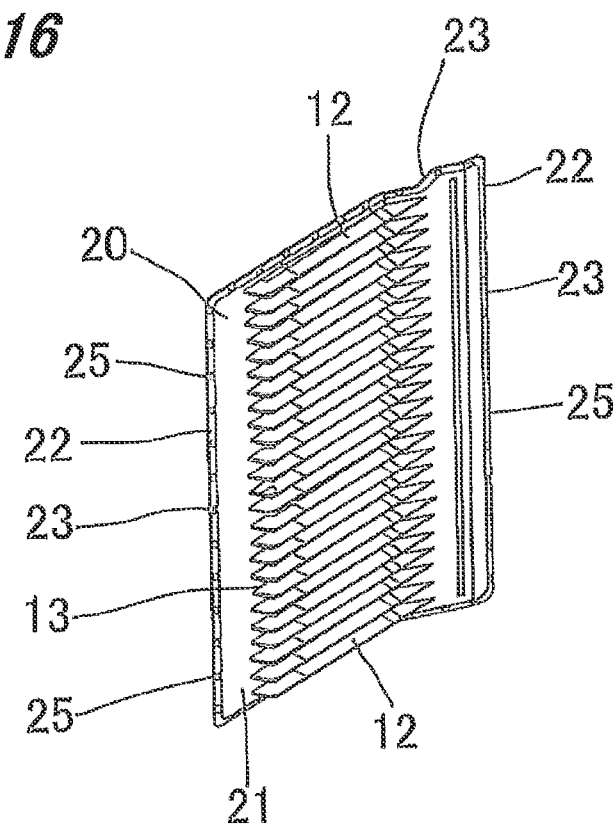
FIG. 16 A perspective view schematically showing a side wall plate according to a third embodiment of a storage container according to the present invention.
Figure 17:
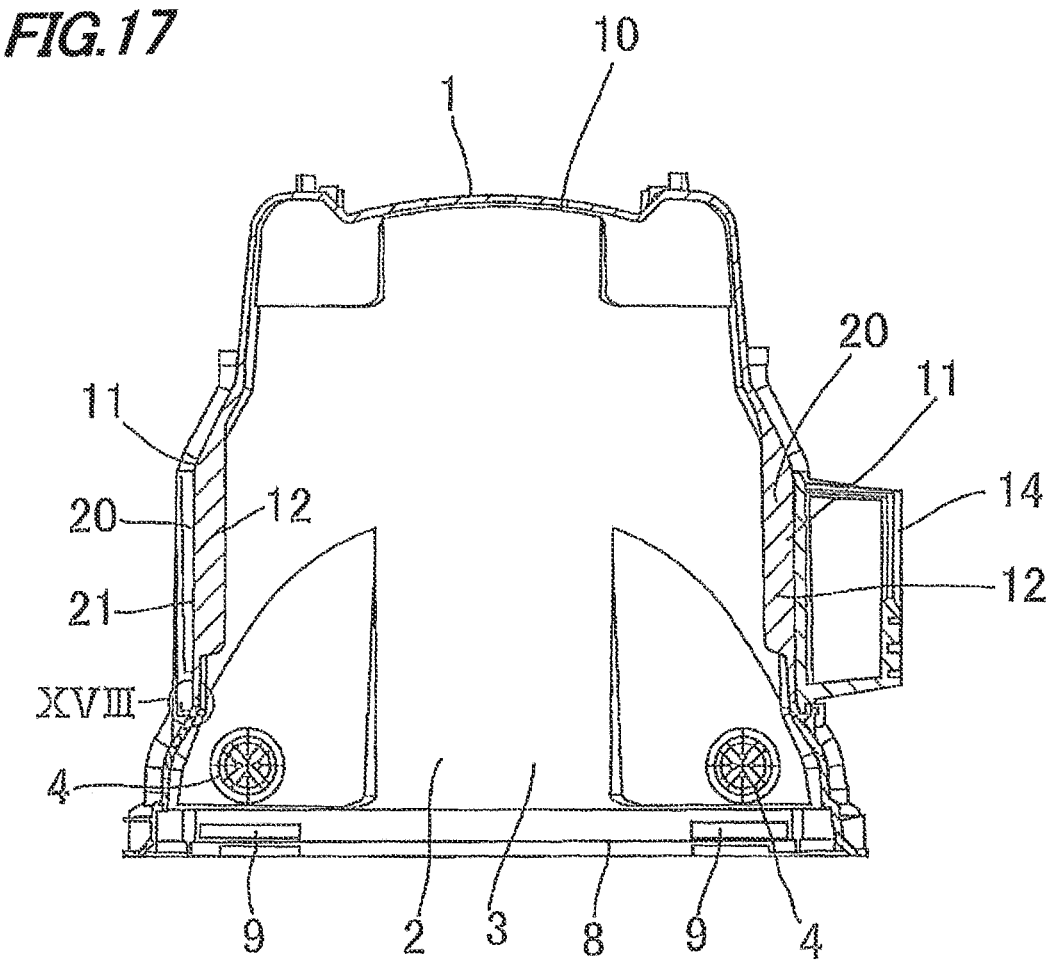
FIG. 17 A sectional plan view schematically showing the container body according to the third embodiment of the storage container according to the present invention.
Figure 18:
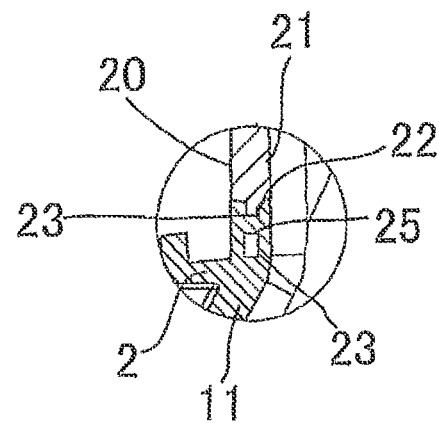
FIG. 18 An enlarged sectional illustration showing a portion XVIII in FIG. 17.

Next, FIGS. 16 to 18 show a third embodiment of the present invention. Also in this case, the thin joint portion 22 of the side wall plate 20 is modified.

As shown in FIG. 18, the thin joint portion 22 in the present embodiment comprises: a rib 23 protruding outward from the peripheral edge of the thick portion 21 of the side wall plate 20; and a plurality of molding material passage holes 25 that are bored in the rib 23 to allow the molding material for the container body 1 to flow thereinto, thus forming a boundary between the thick portion 21 and the peripheral wall 2 of the container body, specifically the base plate 3, ceiling plate 6 and the remaining part of the side walls 11 of the container body 1.

The rib 23 protrudes, in a thin plate form, from the entire edge of the thick portion 21 and surrounds the thick portion 21 endlessly. Further, a plurality of molding material passage holes 25 are bored at a predetermined interval in the longitudinal direction of the ribs 23. Each molding material passage hole 25 is formed in a circular or square shape. Since the other parts are the same as those in the above embodiments, the description is omitted.

Also in this embodiment, the same advantages as those in the above embodiments can be expected. Moreover, since the molding material for the container body 1 flows into the plurality of molding material passage holes 25 and solidifies therein, it is clear that the degree of integration of the container body 1 with the side wall plates 20 improves, and the mechanical strength and leakage properties near the peripheral edge of the side wall plate 20 can be prevented from decreasing.

Figure 19:
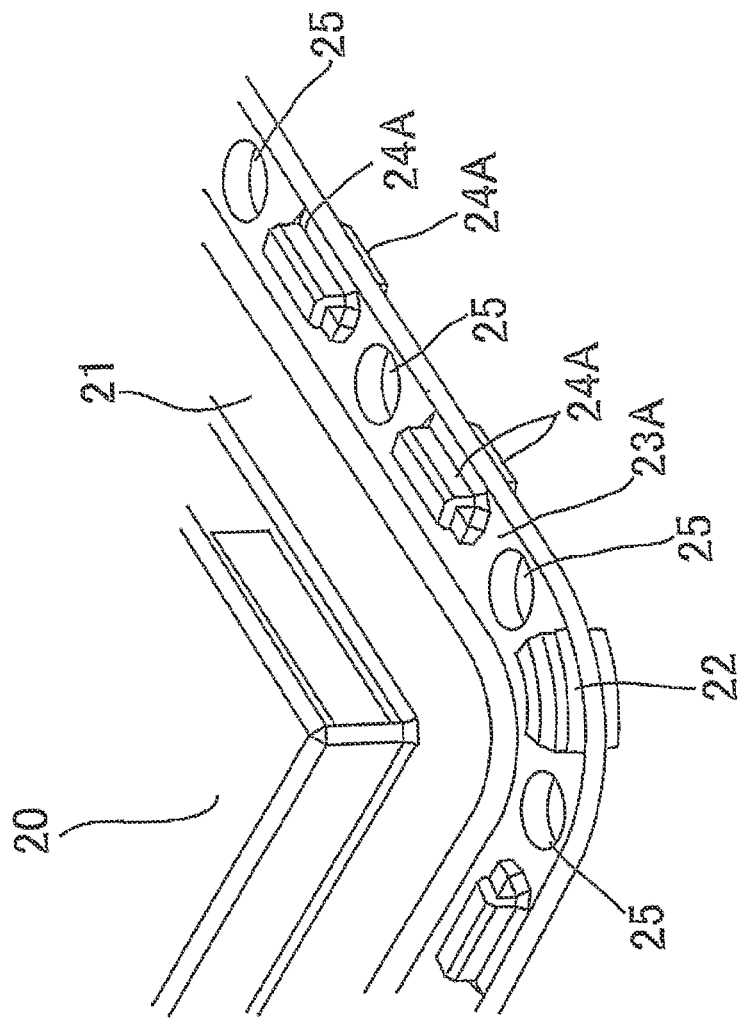
FIG. 19 A partial perspective illustration schematically showing a thin joint portion of a side wall plate in a fourth embodiment of the storage container according to the present invention.

Next, FIG. 19 shows a fourth embodiment of the present invention. In this case, a thin joint portion 22 of the side wall plate 20 is formed by combination of the above embodiments.

The thin joint portion 22 of the present embodiment comprises: an endless rib 23A protruding outward from the peripheral edge of the thick portion 21 of the side wall plate 20; a plurality of bulging ribs 24A protruding on both sides of the middle part of the rib 23A in the directions orthogonal to the protruding direction of the rib 23A; and a plurality of molding material passage holes 25 that are bored in the rib 23A to allow the molding material for the container body 1 to flow thereinto. The thin joint portion 22 forms a boundary between the thick portion 21 and the peripheral wall 2 of the container body, specifically the base plate 3, ceiling plate 6 and the remaining part of the side walls 11 of the container body 1.

The rib 23A protrudes, in a thin plate form, from the entire edge of the thick portion 21, but is extended longer than the rib 23 of the above embodiment. A plurality of bulging ribs 24A and the plurality of molding material passage holes 25 are arrayed in an alternate manner along the longitudinal direction of the rib 23A. Since the other parts are the same as those in the above embodiments, the description is omitted.

Also in this embodiment, the same advantages as those in the above embodiments can be expected, and since the bulging ribs 24A are thick and complicatedly interposed into the peripheral wall 2 of the container body 1 and hard to become detached. Moreover, since the molding material for the container body 1 flows into the molding material passage holes 25 and solidifies therein, it is clear that the degree of integration of the container body 1 with the side wall plates 20 improves, and the mechanical strength and leakage properties near the peripheral edge of the side wall plate 20 can be prevented from decreasing.

Figure 20:
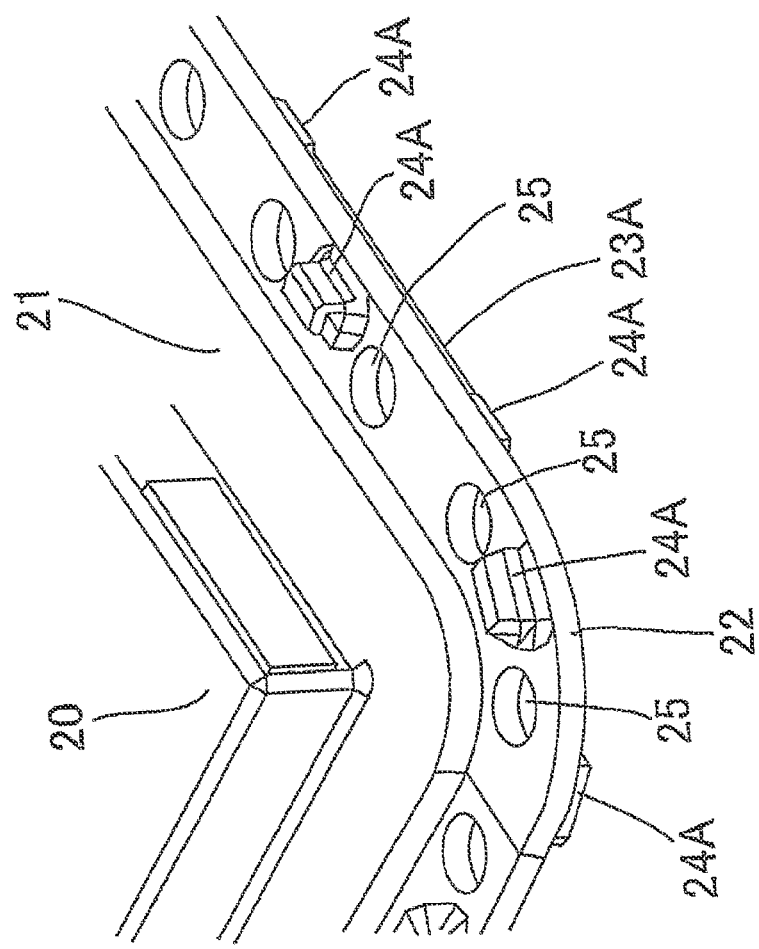
FIG. 20 A partial perspective illustration schematically showing a thin joint portion of a side wall plate in a fifth embodiment of the storage container according to the present invention.

Next, FIG. 20 shows a fifth embodiment of the present invention. In this case, the structure and arrangement of bulging ribs 24A of a thin joint portion 22 are modified.

The thin joint portion 22 of the present embodiment comprises: an endless rib 23A protruding outward from the peripheral edge of the thick portion 21 of the side wall plate 20; a number of bulging ribs 24A protruding on both sides of the middle part of the rib 23A in the directions orthogonal to the protruding direction of the rib 23A; and a number of molding material passage holes 25 that are bored in the rib 23A to allow the molding material for the container body 1 to flow thereinto. The thin joint portion 22 forms a boundary between the thick portion 21 and the peripheral wall 2 of the container body 1, specifically the base plate 3, ceiling plate 6 and the remaining part of the side walls 11 of the container body 1.

The rib 23A protrudes in a thin plate form from the entire edge of the thick portion 21, but is extended longer than the rib 23 of the above embodiments. A number of the bulging ribs 24A are formed on both sides of the middle portion of the rib 23A but at different positions in a staggered manner. Specifically, a plurality of bulging ribs 24A arranged on one side of the middle portion of the rib 23A at a predetermined pitch, and a plurality of bulging ribs 24A arranged on the other side of the middle portion of the rib 23A at the predetermined pitch, but are arranged so as to be shifted in the longitudinal direction of the ribs 23A, and each bulging rib 24A being formed to be smaller than the bulging rib 24A of the above embodiments.

A large number of the molding material passage holes 25 are arranged alternately with a number of the bulging ribs 24A. Each molding material passage hole 25 is bored in a round hole having a diameter smaller than that of the molding material passage hole 25 of the above embodiment, as is required. Since the other parts are the same as those in the above embodiments, the description is omitted.

Also in this embodiment, the same advantages as those in the above embodiments can be expected, and since a large number of bulging ribs 24A are arranged in the staggered manner, the contact area between the container body 1 and the thin joint portion 22 of the side wall plate 20 is enlarged so it can be greatly expected that the degree of integration further improves, and the mechanical strength and leakage properties near the peripheral edge of the side wall plate 20 can be prevented from decreasing.

Additionally, the container body 1 in the above embodiment may have, on the rear side of the base plate 3, a plurality of air supply valves for supplying purge gas such as nitrogen gas from the outside to the inside, and on both sides in the front part of the base plate 3, a plurality of exhaust valves for exhausting air from the inside to the outside. Further, in the above embodiment, the functional resin member is used for the side wall plates 20, but the present invention is not limited to this.

For example, the functional resin member may be a transparent vertically long window plate that forms most of the rear wall 10 of the container body 1. This window plate is used as a viewing window so as to allow a plurality of semiconductor wafers housed in the container body 1 to be seen. In this case, when the container body 1 is manufactured, a substantially rectangular window plate as the functional resin member is injection-molded, and the window plate on the primary side is inserted into the mold for molding the container body 1 with its mold opened, then the mold is clamped. The thus clamped mold is injected and filled with a plasticized molding material to integrate the peripheral edge or the thin joint portion 22 of the window plate with the molten molding material to manufacture the container body 1 on the secondary side by insert molding. In this way, advantages substantially similar to the above advantages can be obtained.

Further, the molding resin of the side wall plate 20 may be a combination of a polyether ether ketone resin and a polycarbonate resin, or a combination of a polyether ether ketone resin and a cycloolefin polymer resin. Further, in the above embodiments, U-shaped grooves 13 are formed between the neighboring upper and lower support pieces 12 on the side wall plate 20, but V-grooves may be formed instead of the U-shaped grooves 13.

Moreover, each support piece 12 may have a substantially I-shaped cross section, a substantially wedge-shaped cross section, or the like. Further, if necessary, a thin joint portion 22 can be formed in part on the peripheral edge of the thick portion 21 of the side wall plate 20. Further, it is possible to bore a required number of molding material passage holes 25 in at least one of the rib 23A and the bulging rib 24A of the thin joint portion 22. Furthermore, the bulging portion 24 of the thin joint portion 22 may have a cross section of a substantially elliptical shape, a substantially semi-elliptical shape, a substantially semi-circular shape, or the like.

INDUSTRIAL APPLICABILITY

The storage container and the manufacturing method thereof according to the present invention are used in the field of manufacturing storage containers for storing substrates such as semiconductor wafers.

DESCRIPTION OF REFERENCE NUMERALS 1 container body (container)
2 peripheral wall (wall)
3 base plate (wall)
6 ceiling board (wall)
8 front
10 rear wall (wall)
11 side wall (wall)
12 support piece

The invention claimed is:

1. A storage container including an insert component as a functional resin member for a container that is insert-molded with a resin-containing molding material, wherein the functional resin member comprises:
   a thick portion having a thickness equal to or greater than a thickness of a wall of the storage container;
   at least one rib protruding, with a thin-plate form, from an entire circumferential edge of the thick portion;
   a plurality of bulging portions formed on a distal end of the at least one rib, the plurality of bulging portions bulging from both sides of the at least one rib; and
   a plurality of molding material passage holes formed on the at least one rib, the at least one rib, the plurality of bulging portions, and the plurality of molding material passage holes are interposed into and joined to the wall of the container, and the plurality of bulging portions and the plurality of molding material passage holes are arrayed on the at least one rib in an alternate manner along a longitudinal direction of the at least one rib.

2. The storage container according to claim 1, wherein the container is a front open box container body capable of arranging and storing a plurality of substrates.

3. The storage container according to claim 2, wherein the functional resin member is a side wall plate in which a plurality of support pieces are arranged adjacent to one another, each support piece being capable of supporting a side of a peripheral edge of a substrate.

4. The storage container according to claim 2, wherein the functional resin member is a window plate that forms a rear portion of the container body and allows a stored substrate to be seen.

5. The storage container according to claim 1, wherein the plurality of bulging portions and the plurality of molding material passage holes are arrayed on each of the at least one rib in the alternate manner along the longitudinal direction of the at least one rib.

6. A manufacturing method for the storage container according to claim 1, the method comprising the steps of:
   inserting a functional resin member into a mold for molding the container; and
   filling the mold with a resin-containing molding material to form the container by integrating the functional resin member with the molding material.

\* \* \* \* \*